United States Patent
Van Den Berg et al.

(10) Patent No.: US 6,224,968 B1
(45) Date of Patent: May 1, 2001

(54) COMPOSITE BODY, PRODUCTION PROCESS AND USE

(75) Inventors: Hendrikus Van Den Berg, Venlo-Blerick (NL); Udo König; Klaus Dreyer, both of Essen (DE); Volkmar Sottke, Mülheim (DE); Hartmut Westphal, Dermbach (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/269,467

(22) PCT Filed: Dec. 30, 1996

(86) PCT No.: PCT/DE96/02519

§ 371 Date: Mar. 23, 1999

§ 102(e) Date: Mar. 23, 1999

(87) PCT Pub. No.: WO98/15671

PCT Pub. Date: Apr. 16, 1998

(30) Foreign Application Priority Data

Oct. 9, 1996 (DE) .................................. 196 41 468
Oct. 9, 1996 (DE) .......................... 296 17 507 U

(51) Int. Cl.$^7$ .................................................. C23C 16/36
(52) U.S. Cl. ................... 428/216; 427/255.2; 428/336; 428/697; 428/698; 428/699; 428/701; 428/702
(58) Field of Search .................... 428/698, 697, 428/699, 701, 702, 336, 216, 469, 472; 427/255.2; 51/295, 307, 309

(56) References Cited

U.S. PATENT DOCUMENTS

| | | | |
|---|---|---|---|
| Re. 32,111 | * 4/1986 | Lambert et al. | 428/216 |
| 3,836,392 | * 9/1974 | Lux et al. | 117/169 R |
| 4,525,415 | * 6/1985 | Porat | 428/698 |
| 4,892,792 | 1/1990 | Sarin et al. | |
| 5,135,801 | 8/1992 | Nystrom et al. | |
| 5,246,787 | * 9/1993 | Schulz et al. | 428/469 |
| 5,693,408 | * 12/1997 | Van Den Berg et al. | 427/255.2 |

FOREIGN PATENT DOCUMENTS

| | | |
|---|---|---|
| 25 05 007 A1 | 8/1975 | (DE) . |
| 36 20 901 A1 | 1/1988 | (DE) . |
| 39 02 532 C1 | 11/1989 | (DE) . |
| 291 784 A4 U | 7/1991 | (DE) . |
| 42 39 234 A1 | 6/1994 | (DE) . |
| 195 18 781 C1 | 9/1996 | (DE) . |
| 0 229 282 | 7/1987 | (EP) . |
| 0 629 713 A2 | 12/1994 | (EP) . |
| 0 732 423 A1 | 9/1996 | (EP) . |
| 60149775 | 8/1985 | (JP) . |
| 61019777 | 1/1986 | (JP) . |
| 1104773 | 4/1989 | (JP) . |
| 4-159004 | 6/1992 | (JP) . |
| 4-315504 | 11/1992 | (JP) . |
| 5-311463 | 11/1993 | (JP) . |

* cited by examiner

*Primary Examiner*—Archene Turner
(74) *Attorney, Agent, or Firm*—Herbert Dubno

(57) ABSTRACT

Disclosed are a composite body and the production and the use thereof. It consists of a substrate body with a single- or multilayer coating, containing either Ti, Zr, Hf, V, Nb carbides, nitrides, carbonitrides and/or Ta and/or $Al_2O_3$ or $ZrO_2$. In order to improve the characteristics of wear from chip removal or another form of abrasion, the invention suggests that a layer of Zr, Hf, V, Nb, Ta or Cr carbonitride be precipitated either directly upon a layer of $Al_2O_3$— or $ZrO_2$— or upon a thin intermediate layer of ZrC or ZrN up to 0,5 μm, or upon a TiN layer up to 0.1 μm, or indirectly upon a layer of $Al_2O_3$— or $ZrO_2$—.

18 Claims, 2 Drawing Sheets

COMPOSITE BODY, PRODUCTION PROCESS AND USE

CROSS REFERENCE TO RELATED APPLICATIONS

The present application is a national stage of PCT/DE/96/02519, filed Dec. 30, 1996, based upon German national application 196 41 468.7 and 296 17 507.2 of Oct. 9, 1996 under the International Convention.

1. Field of the Invention

The invention relates to a composite which is comprised of a substrate body with a coating of one or more layers of carbides, nitrides, carbonitrides of Ti, Zr, Hf, V, Nb and/or Ta and/or of $Al_2O_3$ or $ZrO_2$.

The invention also relates to a process for producing a coating from a carbonitride of the aforementioned metals by CVD or plasma activated CVD on a base body or on a coated base body of a hard metal, cermet, steel or a ceramic.

2. Background of the Invention

The first coatings of the type with which the invention is concern which have become known according to the state of the art, are comprised of titanium carbide with a thickness of up to 8 $\mu$m with which an improved wear resistance effect against free-surface wear can be obtained. Further there are double or multiple coatings of titanium carbide and titanium nitride, especially with an outer layer of titanium nitride, which belong to the state of the art and with which a reduced corrosion can be achieved with cutting inserts used for chip removal. For further improvement of such cutting inserts, multilayer coatings with the layer sequence TiC, Ti(C,N)—TiN have been proposed. In addition, it has been found that the natural brittleness of ceramics like $Al_2O_3$ can be minimized when $Al_2O_3$ in thin layer form is deposited thereon and also Tin, Ti(C,N) and an outer layer of $Al_2O_3$ can comprise multilayer coatings for such use. While the patent literature, for example in the framework of a special coating process as in EP 0 229 282 B1, generally speaks of carbides, nitrides and/or carbonitrides of the elements titanium, zirconium, hafnium, vanadium, niobium and/or tantalum, the described examples are limited to titanium compounds as the coating material, in part, in combination with aluminum oxide. Correspondingly the same can be said for $ZrO_2$ in combination with or as a replacement for oxide-containing coatings. First in DE 36 20 901 A1 or EP 0 250 865 A1 (with the same contents) a cutting insert is described whose edge is coated with titanium carbide, titanium carbonitride and/or titanium nitride and whose outer cover layer is comprised of a thin zirconium nitride coating. The zirconium nitride which has poorer wear characteristics than the aforementioned titanium compounds, is intended to hinder oxidation of the basic layers underlying this layer by atmospheric oxygen so the good wear characteristics of the titanium carbide-titanium carbonitride-and/or titanium nitride coatings are fully retained. In practice, zirconium compounds are not normally used as coating materials.

However, in U.S. Pat. 3,854,991 (or CH-A-585 273) a coated sintered hard metal product is described in which the coating is comprised of HfCN and/or ZrCN and has X-ray diffraction lattice constants which in the case of HfCN and a mixture of HfCN and ZrCN lie between 4.570 and 4.630 angstrom and in the case of ZrCN lie between 4.6 and 4.62 angstrom. In the case of ZrCN, the C/N ratio is clearly less than 1. To produce this hafnium or zirconium carbonitride, a hafnium and/or zirconium halogenide is conducted together with hydrogen, nitrogen and a hydrocarbon at a temperature of 1000 to 1300° C. across a substrate.

OBJECT OF THE INVENTION

It is the object of the present invention to provide a substrate body having a multilayer coating whose wear characteristics for chip removal machining or under otherwise abrasive loading is improved and has of an increased life.

SUMMARY OF THE INVENTION

This object is achieved with composite body in which claim 1 which is characterized in that is composed of a carbonitride of Zr, Hf, V, Nb, Ta or Cr and that this layer is deposited either directly upon an $Al_2O_3$ or $ZrO_2$ layer or upon a thin intermediate layer of a maximum thickness of 0.5 $\mu$m of TiN directly on an $Al_2O_3$ or $ZrO_2$ layer. The aforementioned carbonitride layer preferably has a thickness of at least 2 $\mu$m to a maximum of 6 $\mu$m and/or the $Al_2O_3$ or $ZrO_2$ layer has a thickness of 2 $\mu$m, preferably 3 $\mu$m or more. The respective thicknesses are provided on the cutting corners of composite bodies which are formed as cutting inserts. It is also possible to form the outer layer of the aforementioned carbonitride, especially ZrCN or HfCN, and also to apply one or more outer layers on this carbonitride layer whereby the layer thickness or the total thickness of the one or more outer layers does not exceed 2 $\mu$m and preferably does not exceed 1 $\mu$m. In other words in the framework of the present invention one can obtain equally good solutions when the aforementioned carbonitride layer has coated thereon even extremely thin further layers. Preferably when such composite bodies are used as cutting inserts for turning, the following layer thicknesses are used: TiN: 0.5 to 2 $\mu$m; TiCN: 9 to 13 $\mu$m; $Al_2O_3$: 2 to 4.5 $\mu$m and ZrCN: 2 to 4 $\mu$m. For corresponding cutting inserts used for milling preferably the following layer thicknesses are chosen: TiN: 0.5 to 2 $\mu$m; TiCN: 9 to 13 $\mu$m; $Al_2O_3$ and ZrCN: 4 to 6 $\mu$m, whereby one of the layers $Al_2O_3$ and ZrCN is at least 1 $\mu$thick.

The substrate body can, according to a further feature of the invention be composed of hard metal, a steel, a cermet or a ceramic, especially a material based on $Si_3N_4$. Preferred hard metal substrate bodies are comprised of 5.5 to 8.5 mass % Co, preferably 5.5 to 6.5 mass % Co as a binder, the balance WC. Alternatively, the substrate body can comprise 1 to 3 mass % TiC, 2 to 5 mass % TaC, 1 to 3 mass % NbC and 5.5 to 8.5 mass % Co, the balance WC.

For producing the carbonitride layer from Zr, Hf, V, Nb, Ta or Cr, according to a first alternative, a plasma-activated CVD is used in which the reactive gas atmosphere at the set reaction chamber, apart from hydrogen, argon and a chloride of the named metal, also contains ionized and/or nonionized carbon-nitrogen donors with triple bonding, whereby the bond spacing between the carbon and nitrogen at room temperatures lies between 0.114 and 0.118 nm. Especially, the ionized and nonionized C-N donors are generated by ionization and thermal dissociation of gasses of the cyanide group (CN-triple bonding) by means of a plasma activation at temperatures between 400° C. and 700° C. and a pressure of 100 to 1000 Pa. Suitable substances, which can liberate cyanide radicals (—CN) at the reaction temperature, are organic compounds like hydrogencyanide, cyanamide, cyanogen, cyanoacetylene and acetonitrile. In the deposition, the substrate body can be connected as the cathode for the plasma activation and a pulsed direct current can be applied, such as the process described for example in DE 38 41 731 C1.

Alternatively it is also possible to apply the named hard material coating from carbonitride by means of CVD, whereby the gas phase, at a reaction temperature between 700° C. and 1100° C. and preferably at pressures between 5 kPA and 100 kPa, contains, in addition to $H_2$ and/or Ar and chlorides of the above-mentioned metals, also carbon donors and nitrogen donors which have a C—N molecular group. This is preferably a cyanide group with a triple bond between the carbon and nitrogen, whose spacing at room temperature amounts to between 0.114 and 0.118 nm. Such compounds are hydrogen cyanide, cyanamide, cyanogen, cyanacetylene or acetonitrile. Alternatively or in part, such gaseous compounds can also be used which have CN molecular groups with a single bond between the carbon and the nitrogen. Molecules with single CN bonds include methylamine and ethylenediamine. The present invention includes within its framework appropriate substances containing the cyanide group; compounds of this kind are in principle known in the state of the art and are for example described in DE 25 05 009 A1. Other gaseous media can be gated into the reaction vessel which are capable of forming cyano groups at the reaction temperature.

Preferred uses of the composite bodies according to the invention are as abrasively stressed wear parts or in the chip removal machining field, here especially for turning or milling.

In a concrete example, a hard metal substrate body with 6 mass % Co, balance WC, is provided with the following layer sequence from inside outwardly in the indicated thicknesses: 1 μm TiN, 10 μm TiCN, 4 μm $Al_2O_3$ and 3 μm ZrCN. The outermost zirconium nitride layer is of full density, free from cracks and has a positive compressive intrinsic stress. The C/N ratio was about 1.

Cutting inserts used for chip removal machining in the milling, boring or turning fields have useful lives which, depending upon the chip removal machining conditions which can be 1.2 to 4 times greater than the lives of multilayer coated composite bodies which are known from the state of the art and which have as the outermost layer the layer sequence TiN, $Al_2O_3$ or ZrN.

The good wear resistance can be obtained also when, instead of the outer ZrCN cover layer other thin layers, for example of TiN are applied. However these cannot have as many layers beneath the layer combination $Al_2O_3$/ZrCN and cannot have thicknesses of layers beneath the $Al_2O_3$/ZrCN layer sequence as in the present case. The improved system of the present invention provides greater wear resistance with layers having a total layer thickness which can amount to up to 26 μm in contrast to earlier arrangements. The same applies also for the case in which zirconium in the carbonitride layer is completely or partly replaced by hafnium, vanadium, niobium, tantalum or chromium.

The good resistance to wear properties can also be realized when between the layer sequence $Al_2O_3$/ZrCN, a thin intermediate layer of TiN of a maximal thickness of 0.1 μm to TiN or a thin layer of a maximum of 0.5 μm of ZrC or ZrN is provided.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
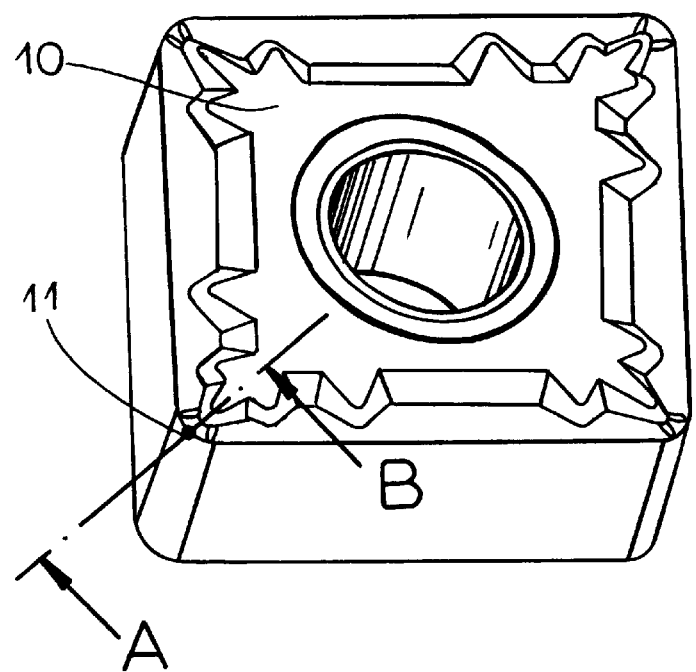
FIG. 1 is a perspective view of a cutting insert according to the invention.
Figure 2:
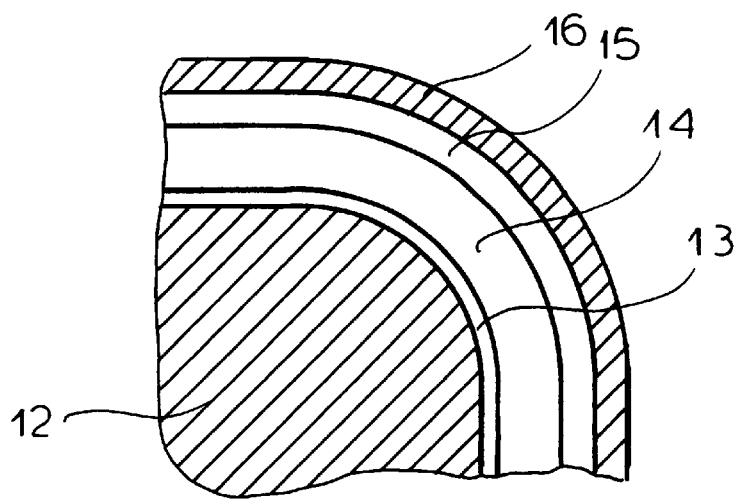
FIG. 2 is a section along the line A–B of FIG. 1 drawn to a larger scale.
Figure 3:
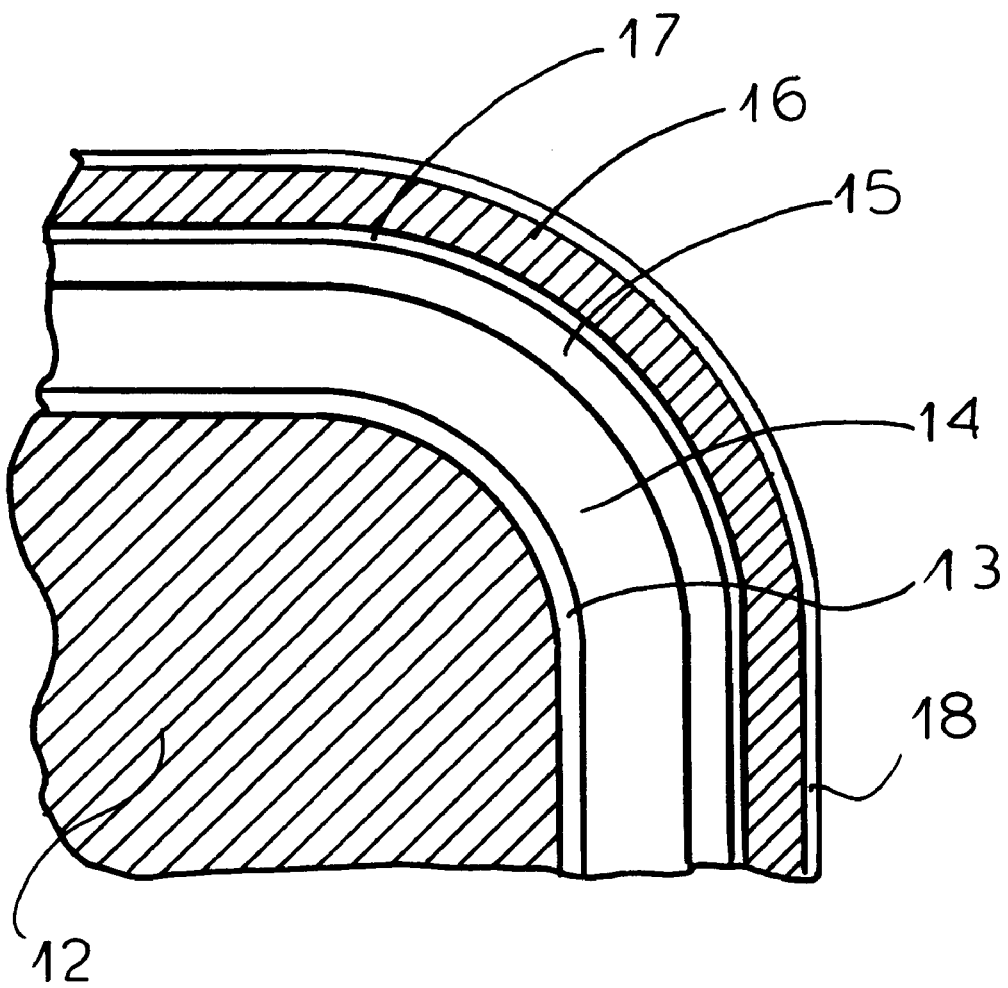
FIG. 3 is a view similar to FIG. 2 but illustrating another embodiment.

FIG. 1 shows a cutting insert 10, whose cutting corner 11 is shown in section along the line A–B in FIG. 2 or in an alternative configuration in FIG. 3, schematically.

As can be ascertained from FIG. 2, on a substrate body 12 which is comprised of a WC hard metal with 6% Co as a binder, a first 1 μm thick layer 13 of TiN, a second 10 μm thick layer 14 of TiCN, a further 4 μm thick layer 15 of $Al_2O_3$ and an outer 3 μm thick cover layer 16 of ZrCN are applied.

The embodiment of FIG. 3 differs from the aforementioned embodiment according to FIG. 2 in that between the layers 16 of ZrCN and the layer 15 of $Al_2O_3$ there is provided a 0.1 μm thick layer 17 of TiN. Additionally an outer 0.1 μm thick TiN layer is provided as the outer coating layer.

From the subsequent chip removal machining results it can be seen (independently of the type of turning plate) that turning plates coated according to the invention have significantly longer operating lives than the turning plates known from the art.

EXAMPLE 1

Workpiece: Ball bearing ring, diameter 152×36
Material of workpiece: Steel 100Cr6
Cutting speed: 280 m/min
Feed: 0.8 mm/per revolution
Cutting depth: 1.0 mm

| Turning plate | State of the art | According to the invention |
|---|---|---|
| Plate shape | SNMG120416 | SNMG120416 |
| Coating | Ti(C,N)—$Al_2O_3$—TiN | TiN—Ti(C,N)—$Al_2O_3$—Zr(C,N) |
| Layer thickness total (μm) | 15 | 15 |
| Workpieces per cutting corner | 125 | 150 |

EXAMPLE 2

Workpiece: Axle pin, diameter 40×100
Material of workpiece: Steel C55
Cutting speed: 200 m/min
Feed: 0.7 mm/per revolution
Cutting depth: 2.5 mm–3.0 mm

| Turning plate | State of the art | According to the invention |
|---|---|---|
| Plate shape | WNMG050414 | WNMG050414 |
| Coating | TiC—$Al_2O_3$—TiN | TiN—Ti(C,N)—$Al_2O_3$—Zr(C,N) |
| Layer thickness total (μm) | 15 | 15 |
| Workpieces per cutting corner | 195 | 235 |

EXAMPLE 3

Workpiece: Free-running ring
Material of workpiece: Steel Ck45

Cutting speed: 220 m/min
Feed: 0.25 mm/per revolution
Cutting depth: 2 mm

| Turning plate | State of the art | According to the invention |
|---|---|---|
| Plate shape | WNMG050408 | WNMG050408 |
| Coating | TiC—Al$_2$O$_3$ | TiN—Ti(C,N)—Al$_2$O$_3$—Zr(C,N) |
| Layer thickness total ($\mu$m) | 15 | 14 |
| Workpieces per cutting corner | 50 | 143 |

EXAMPLE 4

Workpiece: Drive shaft 50 mm diameter×310
Material of workpiece: Steel 16MnCr5
Cutting speed: 260 m/min
Feed: 0.4 mm/per revolution
Cutting depth: 2 mm–3 mm

| Turning plate | State of the art | According to the invention |
|---|---|---|
| Plate shape | DNMG150612 | DNMG150612 |
| Coating | TiC—Al$_2$O$_3$—TiN | TiN—Ti(C,N)—Al$_2$O$_3$—Zr(C,N) |
| Layer thickness total ($\mu$m) | 14 | 14 |
| Workpieces per cutting corner | 130 | 170 |

What is claimed is:

1. A composite comprising a substrate body with a multilayer coating which includes at least:

a) a first, 0.5 $\mu$m to 2 $\mu$m thick inner layer of TiN;
   b) a second, 9 $\mu$m to 13 $\mu$m thick layer of a carbonitride of an element of the group IVa of the periodic system;
   c) a third, at least 2 $\mu$m thick of Al$_2$O$_3$ or ZrO$_2$; and
   d) a fourth outer layer of a carbonitride of Zr, Hf, V, Nb, Ta or Cr with a thickness in the range of 2 $\mu$m to 6 $\mu$m 2. The composite according to claim 1 wherein said coating has a layer sequence of 0.5 $\mu$m to 2 $\mu$m thick TiN; 9 $\mu$m to 13 $\mu$m thick TiCN, 2 $\mu$m to 4.5 $\mu$m thick Al$_2$O$_3$ and 2 $\mu$m to 4 $\mu$m thick ZrCN.

3. The composite according to claim 1 wherein between the third and the fourth layers an intermediate layer is provided which is comprised of ZrC or ZrN with a maximum thickness of 0.5 $\mu$m or of TiN with a maximum thickness of 0.1 $\mu$m.

4. The composite according to claim 1 wherein the third layer has a thickness of at least 3 $\mu$m.

5. The composite according to claim 1 wherein the outer layer of a carbonitride of Zr, Hf, V, Nb, Ta or Cr, additionally one or more outer layers are deposited, whereby the total thickness of the one or more layers does not exceed 2 $\mu$m.

6. The composite according to claim 1 wherein the total thickness of the third and fourth layers is at least 5 $\mu$m to a maximum of 10 $\mu$m.

7. The composite according to claim 1 wherein the substrate body is comprised of hard metal, steel, a cermet or a ceramic.

8. The composite according to claim 7 wherein the substrate body is an Si$_3$N$_4$ ceramic.

9. The composite according to claim 7 wherein the substrate body is comprised of 5.5 to 8.5 mass % Co, the balance WC.

10. The composite according to claim 9 wherein the hard metal is comprised of 5.5 to 6.5 mass % Co as a binder, the balance WC.

11. The composite according to claim 7 wherein the substrate body is a hard metal comprised of 5.5 to 8.5 mass % Co as a binder, 1 to 3 mass % TiC, 1 to 5 mass % TaC, 1 to 3 mass % NbC, the balance WC.

12. A method of making a composite comprising the steps of:

(a) forming a substrate body of a hard metal, steel, a cermet or a ceramic with a TiN coating; and
   (b) depositing a carbonitride of Zr, Hf, V, Nb, Ta or Cr on said TiN coating by plasma activated CVD at a reaction temperature from a reactive gas containing hydrogen, argon, a chloride of Zr, Hf, V, Nb, Ta or Cr, and an ionized or nonionized carbon-nitrogen donor with carbon-nitrogen triple bonding and a carbon-nitrogen bond distance of 0.114 to 0.118 nm.

13. The method defined in claim 2 wherein the ionized or nonionized carbon-nitrogen donor is formed by ionization and thermal dissociation of a gas containing cyanide groups by plasma activation at a temperature between 400° C. and 700° C. and a pressure of 100 to 1000 Pa.

14. The method defined in claim 13 wherein the plasma activation is effected with pulsed direct current and the substrate body connected as a cathode.

15. A method of making a composite comprising the steps of:

(a) forming a substrate body of a hard metal, steel, a cermet or a ceramic with a TiN coating; and
   (b) depositing a carbonitride of Zr, Hf, V, Nb, Ta or Cr on said TiN coating by plasma activated CVD at a reaction temperature between 700° C. and 1100° C. and a pressure of 5 kPa to 100 kPa from a reactive gas containing hydrogen, argon, a chloride of Zr, Hf, V, Nb, Ta or Cr, and an ionized or nonionized carbon-nitrogen donor with a carbon-nitrogen molecular group.

16. The method defined in claim 15 wherein said carbon-nitrogen donor has a cyanide group with carbon-nitrogen triple bonding and a carbon-nitrogen bond distance of 0.114 to 0.118 nm.

17. The method defined in claim 16 wherein said carbon-nitrogen donor is acetonitrile.

18. The method defined in claim 15 wherein said carbon-nitrogen molecular group has a single bond between the carbon and the nitrogen.

* * * * *